United States Patent [19]
Gittleman et al.

[11] Patent Number: 6,107,195
[45] Date of Patent: Aug. 22, 2000

[54] METHOD FOR DEPOSITING A LOW-RESISTIVITY TITANIUM-OXYNITRIDE (TiON) FILM THAT PROVIDES FOR GOOD TEXTURE OF A SUBSEQUENTLY DEPOSITED CONDUCTOR LAYER

[75] Inventors: Bruce David Gittleman, Scottsdale, Ariz.; Vu Bui, West Nyack, N.Y.

[73] Assignee: Tokyo Electron Limited, Tokyo, Japan

[21] Appl. No.: 08/866,324

[22] Filed: Jun. 18, 1997

[51] Int. Cl.$^7$ .................................................. H01L 21/44
[52] U.S. Cl. .......................... 438/653; 438/654; 438/656; 438/665; 438/688; 204/192.17
[58] Field of Search ..................................... 438/653, 654, 438/648, 656, 643, 688, 637, 980, 665, 660; 204/192.17

[56] References Cited

U.S. PATENT DOCUMENTS

| 5,290,731 | 3/1994 | Sugano et al. ........................... | 438/174 |
|---|---|---|---|
| 5,449,641 | 9/1995 | Maeda ..................................... | 384/195 |
| 5,504,043 | 4/1996 | Ngan et al. .............................. | 438/247 |
| 5,514,908 | 5/1996 | Liao et al. ............................... | 257/751 |
| 5,705,429 | 1/1998 | Yamaha et al. .......................... | 438/194 |
| 5,741,721 | 4/1998 | Stevens .................................... | 438/60 |
| 5,750,439 | 5/1998 | Naito ....................................... | 438/648 |
| 5,858,184 | 1/1999 | Fu et al. .................................. | 204/192.17 |
| 5,961,791 | 10/1999 | Frisa et al. .............................. | 204/192.1 |
| 5,985,754 | 11/1999 | Aizawa ................................... | 438/639 |

*Primary Examiner*—Wael Fahmy
*Assistant Examiner*—Kurt Eaton
*Attorney, Agent, or Firm*—Wood, Herron & Evans, L.L.P

[57] ABSTRACT

A method of minimizing intragranular oxidation of TiON and providing a low resistivity film that provides for highly textured metal overlayers. The method provides an in situ diffusion barrier for subsequent high temperature metal deposition or processes. An in situ process eliminates the need for a fortification anneal immediately following the barrier deposition, thus reducing the number of metal processing steps and providing for a more economical process or for subsequent high temperature metal deposition. The surface properties of the TiON allow for improved texture in those metal overlayers as well as low diffusion barrier resistivity.

9 Claims, 4 Drawing Sheets

_US 6,107,195_

METHOD FOR DEPOSITING A LOW-RESISTIVITY TITANIUM-OXYNITRIDE (TION) FILM THAT PROVIDES FOR GOOD TEXTURE OF A SUBSEQUENTLY DEPOSITED CONDUCTOR LAYER

BACKGROUND OF THE INVENTION

In the manufacture of integrated circuits (IC's), aluminum is a choice metal for fill applications. TiN may also fulfill this function for future Cu metalization schemes. Currently, titanium nitride (TiN) is used to prevent the diffusion of Al into the substrate. TiN is also used as an adhesion layer for a subsequent CVD-tungsten process or in the production of anti-reflective coating applications. Presently as chip geometries shrink, smaller contact/via geometries are necessary. In order to accommodate the smaller geometries a reduced barrier thickness in the bottom of the via is desired to maximize the area of the via occupied by the primary conductor. It is also desired to process IC's at higher temperatures for Al fill applications.

One conventionally known deposition technique is sputter deposition. In sputter deposition, a target of material, such as a metal target, is positioned in a vacuum chamber generally opposite a substrate which is to receive a layer or plug of target coating material. A working gas is introduced into the vacuum chamber proximate the target and is electrically excited to create a gas plasma including positively charged gas ions. The target is negatively biased and the positively charged plasma species bombard the negative target, thus dislodging target material or "sputtering" the target. The dislodged or sputtered material is deposited onto the substrate surface and covers the substrate surface to fill any contacts formed in the exposed substrate surface.

Current processes sputter deposit a TiN barrier layer which undergoes a subsequent ex situ anneal to provide sufficient diffusion barrier properties for Al fill applications. TiON films are known to provide diffusion barrier properties which are superior to TiN without the need for an ex-situ processing step.

The use of in situ TiON diffusion barriers increases manufacturing throughput by eliminating the ex-situ anneal step. Capital costs are also decreased due to the elimination of the equipment relating to the ex-situ anneal step. While the known TiON films improve throughput and decrease costs, they are known to degrade the crystalline structure of the interconnect metal such as Al or Cu which is subsequently deposited. Similarly, the oxidation of a TiN barrier surface due to exposure to the atmosphere prior to the deposition of the Al interconnect is known to degrade the texture of the Al. The degradation of the aluminum is believed to decrease the interconnect reliability because of reduced electromigration lifetimes.

FIELD OF THE INVENTION

The present invention provides a process for forming a film of titanium oxynitride which has surface properties which allow for Improved texture in those metal overlayers.

SUMMARY OF THE INVENTION

The present invention obviates the need for an ex situ anneal process without the degradation of the fiber texture of the subsequently deposited Al by nitriding the Ti during the sputter deposition process and adding O to the gas mixture. The film is sputter deposited in a high nitrogen low oxygen atmosphere and at a high substrate temperature. The primary improvement in diffusion barrier properties is believed to occur when low levels of oxygen are incorporated into the grain boundaries without oxidizing the intragranular diffusion barrier. The present invention uses a high flow of nitrogen as compared to the flow of oxygen within the sputter chamber and a high deposition temperature to minimize the oxygen content of the grains of titanium oxynitride.

DETAILED DESCRIPTION OF THE INVENTION

Figure 2:
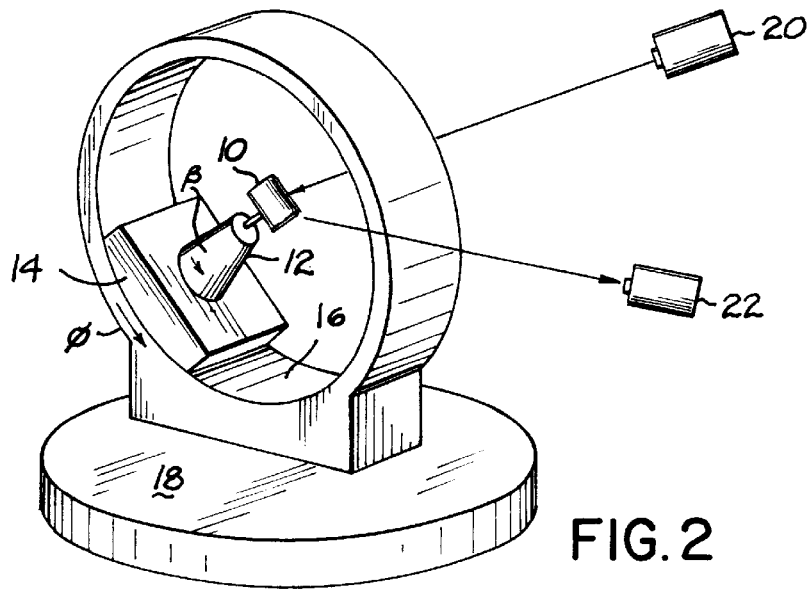
FIG. 2 is a schematic representation of an x-ray diffraction pole figure measurement apparatus.

Fiber texture is a type of x-ray diffraction (XRD) measurement which is determined by the pole figure technique. In a pole figure measurement, the x-ray source and detector are fixed such that x-rays diffracted from a particular crystal plane in the sample are detected. A typical apparatus for the pole figure measurement is shown in FIG. 2. The pole figure measurement apparatus 8 includes sample 10 mounted on primary stage 12. The primary stage 12 is rotatably mounted on secondary stage 14. Secondary stage 14 rotates about secondary stage track 16. Secondary stage track 16 is mounted upon base 18. The rotation of primary stage 12 determines the angle $\beta$ and the movement of the secondary stage 14 about the secondary stage track 16 determines the angle $\phi$. At each position ($\phi$, $\beta$) x-rays submitted from x-ray source 20 impinge upon sample 10 and are diffracted to be sensed by x-ray detector 22.The sample is incrementally tilted through 90° about the angle $\phi$ by the movement of secondary stage 14. At each tilt increment, the sample is rotated as azimuthally through the angle $\beta$ by the rotation of primary stage 12. At 0°$\beta$, the diffracted signal is detected for grains parallel to sample surface 10. Rotating the primary stage 12 by the angle $\beta$ allows detection of grains tilted at $\beta$° with respect to the sample 10 surface. The data obtained at each data point ($\phi$,$\beta$)provides information about grain orientation throughout the entire volume. If the pole figure exhibits azimuthal symmetry, the plot of the diffracted intensity along any radius is referred to as a fiber texture plot.

Figure 1:
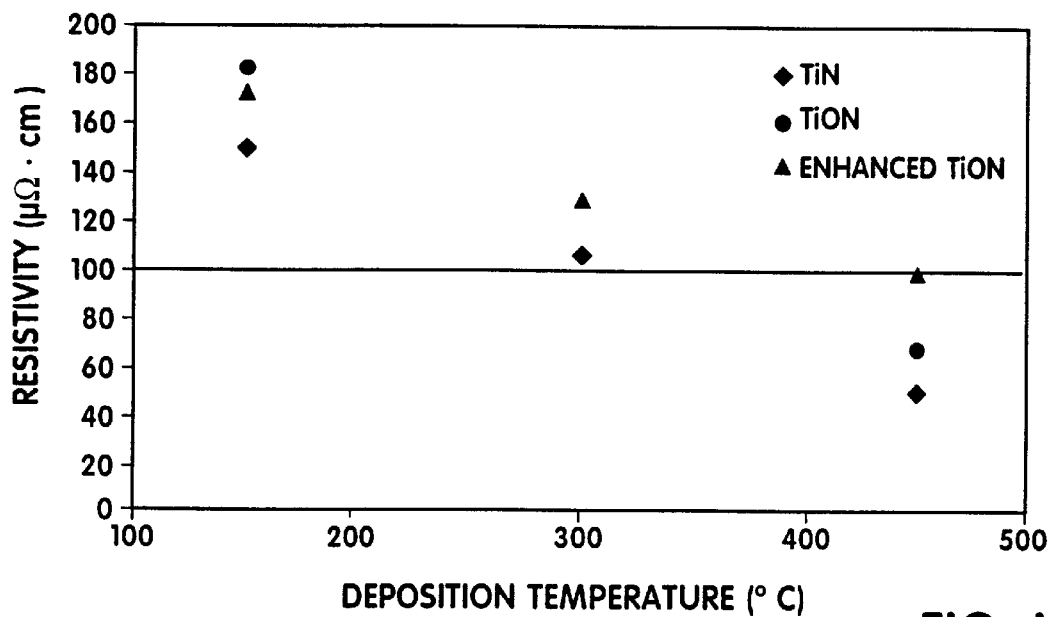
FIG. 1 is a graph showing the wafer resistivity of TiN, TiON and enhanced TiON ((E)TiON) as a function of deposition temperature.
Figure 3B:
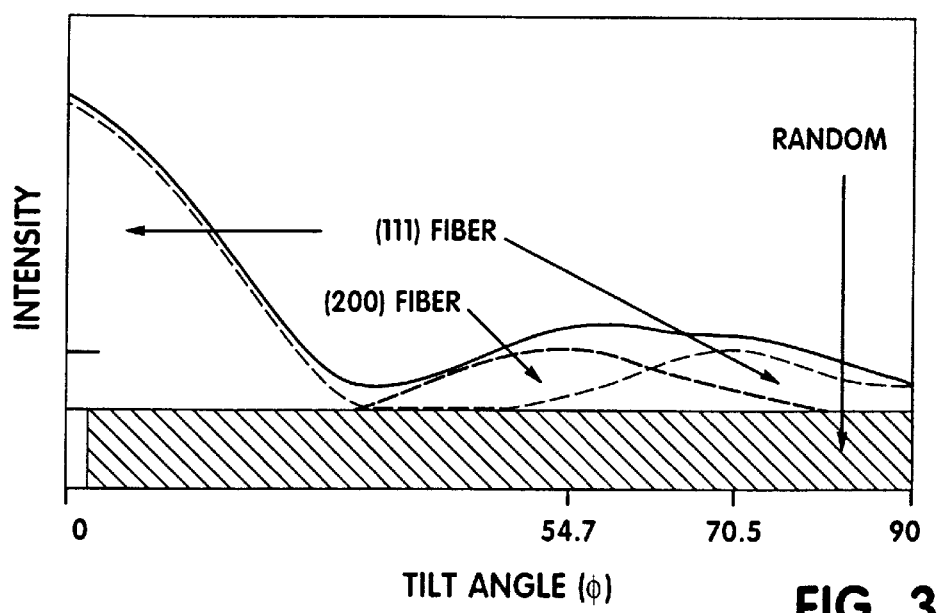
FIG. 3B is a fiber texture plot corresponding to the data of FIG. 3A.
Figure 3A:
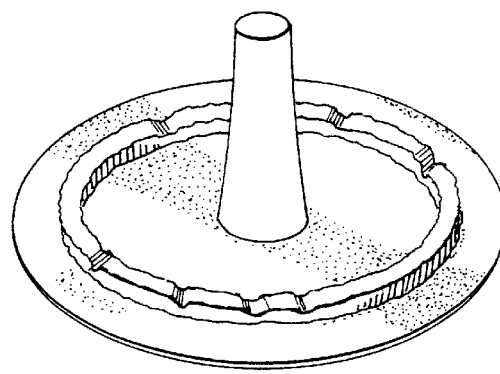
FIG. 3A is a representation of the three-dimensional graphical data of the pole figure measurement for Al from (111) crystal planes.
Figure 4A:
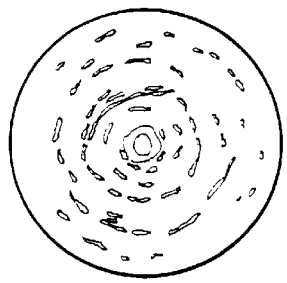
FIGS. 4A–4D is a representation of the x-ray diffraction pole figures for TiN, TiON and enhanced TiON at 150° C. and 450° C.
Figure 4B:
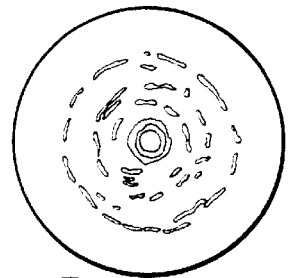
Figure 4C:
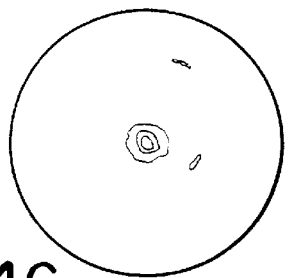
Figure 4D:
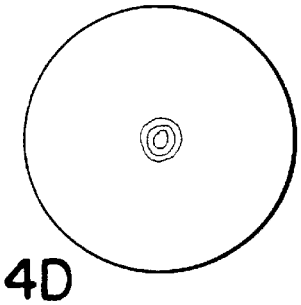

FIG. 3A is a pole figure and FIG. 3B is the corresponding fiber texture plot for Al from (111) oriented crystal planes.

The components in both the pole figure FIG. 3A and fiber texture plot FIG. 3B show the diffracted intensity from (111) planes in (200) oriented grains. The integrated areas under the curves and background level in the fiber texture plot are used to determine the volume fraction of (111) and (200) grains normal to the substrate, referred to as the 111 and 200 volume fractions respectively, and those grains which are randomly oriented with respect to this direction. The intensity of the (111) peak as a function of tilt angle gives the distribution of the grain tilt normal to the substrate.

Previous work, D.B. Knorr, et al., 1991 MRS Symp.on Mat. Rel. in Microelectronics, vol. 225, page 21, has shown the relationship between thin film crystalline orientation and fiber texture and electromigration (EM) reliability. The correlation between XRD fiber texture and EM Metrics EM Test Temperature at 225° is shown in Table I.

TABLE I

| Sample | Mean Grain Size ($\mu$m) | Al Volume Fraction 111 (%) | Random Volume Fraction (%) | Al FWHM° 111 | Mean Time to Failure, $t_{50}$ (hours) | Failure Distribution Standard Deviation, $\sigma$ |
|---|---|---|---|---|---|---|
| 1 | 0.83 | 77 | 23 | 11 | 736 | 0.2 |
| 2 | 0.75 | 78 | 22 | 17 | 235 | 1.23 |
| 3 | 0.75 | 58 | 42 | 17 | 106 | 2.18 |

Samples 1 and 2 have random volume fractions and mean grain sizes that are approximately equal. Therefore, samples 1 and 2 show that the mean time to failure ($t_{50}$) and standard deviation failure distribution ($\sigma$) depend on the full width at half maximum (FWHM) of the 111 fiber texture peak. With increasing FWHM of the 111 fiber texture peak $t_{50}$ decreases and $\sigma$ increases. Samples 2 and 3 show that $t_{50}$ and $\sigma$ also depend on the random volume fraction. These samples have equal mean grain sizes and FWHM 111. With increasing random volume fraction, $t_{50}$ decreases and a increases. Therefore, it has been determined that a high Al volume fraction 111 and a low FWHM are desirable to improve the mean time to failure.

As set forth in Table II, FIG. 4 shows the Al 111 pole figure data for samples of TiN deposited at 150° C.; and 450° C. enhanced TiON, (E)TiON, deposited at 150° C.; and TiON deposited at 450° C. Pole figure A shows an XRD Al 111 pole figure for Wafer 1, processed at 150 C (TiN). Pole figure B shows an XRD Al 111 pole figure for Wafer 6, processed at 150 C (ETiON). Pole figure C shows an XRD Al 111 pole figure for Wafer 11, processed at 450 C (TiN). Pole figure D shows an XRD Al 111 pole figure for Wafer 13, processed at 450 C (TiON).

An Al layer 350 nm thick was deposited on a Ti(40 nm)-barrier(75 nm) underlayer. The Ti and TiON were deposited in the same chamber at a temperature of 450° C. The Al deposition temperature was 200° C. There were no vacuum breaks during the stack deposition. After the Al deposition each stack was furnace annealed at 450° C. for one hour in nitrogen.

Table II summarizes the results of the data reduction for these samples. Based upon the data of Table II, it is evident that Al deposited on 450° C. TiON has as good or better texture than the 450° C. TiN and that the Al deposited on 150° C. (E)TiON has inferior texture compared to that of the Al deposited on the 150° C. TiN and 450° C. TiN and TiON samples.

TABLE II

| Sample | Al Volume Fraction 111 (%) | Al Volume Fraction Random (%) | Al FWHM° 111 |
|---|---|---|---|
| 450° C. TiON | 86 | 14 | 3.1 |
| 450° C. TiN | 86 | 14 | 3.2 |
| 150° C. TiN | 83 | 17 | 3.7 |
| 150° (E)TiON | 70 | 30 | 7.8 |

Figure 5:
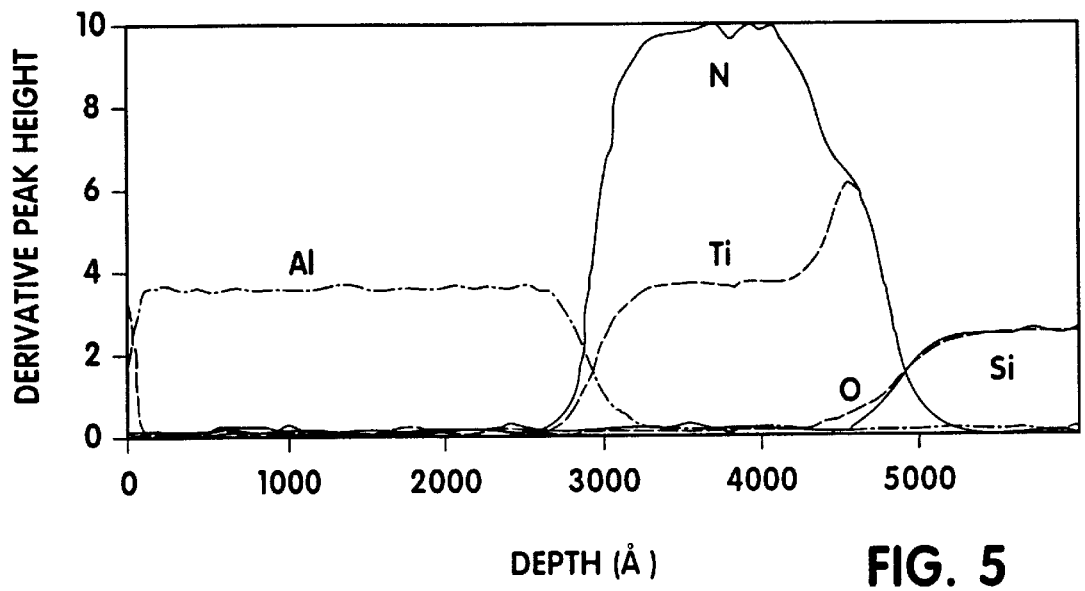
FIG. 5 is an AES depth profile of a Ti(40 nm)-TiON(75 nm)-AlCu 0.5%(350 nm) stack.

FIG. 5 is an Auger Electron Spectrograph (AES) depth profile of Ti(40 nm)-TiON(75 nm)/Al (350 nm) stack after annealing at 450° C. for one hour in nitrogen. The Ti and TiON were deposited in the same chamber at a temperature of 450° C. The subsequent Al deposition was performed at 200° C. There were no vacuum breaks during the stack deposition. As can be seen in FIG. 5, the oxygen content in the TiON film is at the lower limit at the AES detector except at the TiON-Ti interface. Some oxygen is also seen to exist in the Ti film.

Figure 6:
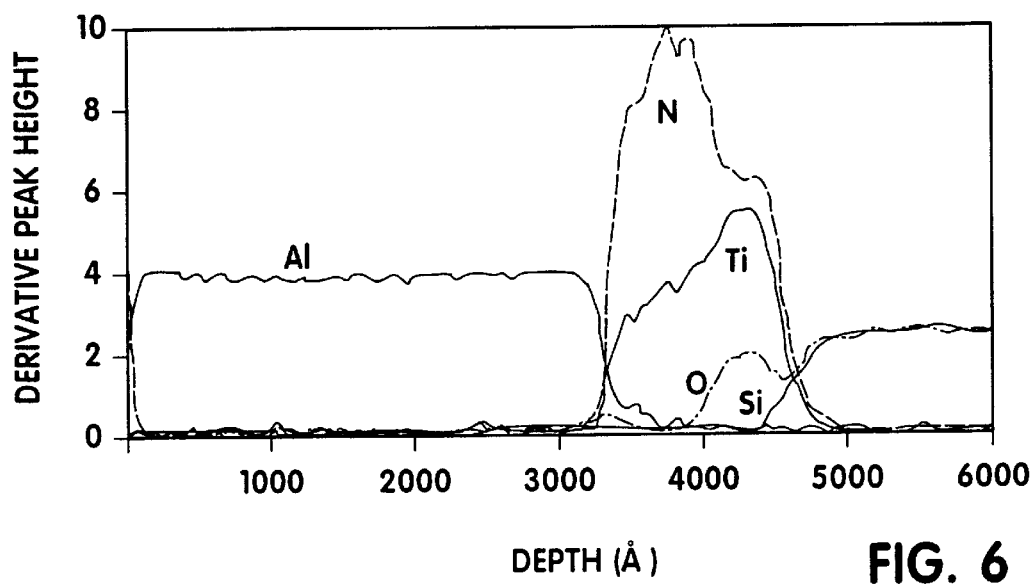
FIG. 6 is a AES depth profile of a Ti(40 nm)-(E)TiON(75 nm)-AlCu 0.5%(350 nm) stack.

FIG. 6 is an AES depth profile of a Ti(40 nm)-(E)TiON(75 nm)/ AlCu 0.5% (350 nm) stack after furnace annealing at 450° C. for one hour in nitrogen. The Ti and (E)TiON were deposited in the same chamber at a temperature of 150° C. The subsequent Al deposition was performed at a temperature of 200° C. There were no vacuum breaks during the stack deposition. As is evident in FIG. 6, there is a significant amount of oxygen at the Al-(E)TiON interface as compared to the absence of oxygen at the Al-TiON interface in FIG. 5.

In order to obtain no measurable oxygen content, the rate of the O-Ti reaction must be slowed and the unreacted oxygen must be able to diffuse out of the film or desorb from the film surface or it will eventually replace the nitrogen bonded to titanium in the film. Saturation of the titanium bonds by nitrogen has been accomplished by a nitrogen to oxygen flow ratio of 25:1. While the ratio of 25:1 is known to work it is believed that ratios of N to O which are greater that about 15:1 would allow the Ti to preferentially react with N rather than O to form the titanium oxynitride layer of the present invention. Evidence for the mobility of oxygen at the deposition temperature of 450° C. can be seen in the concentration of the oxygen at the barrier—Ti interface, and the absence of oxygen in the bulk of the barrier.

Figure 7:
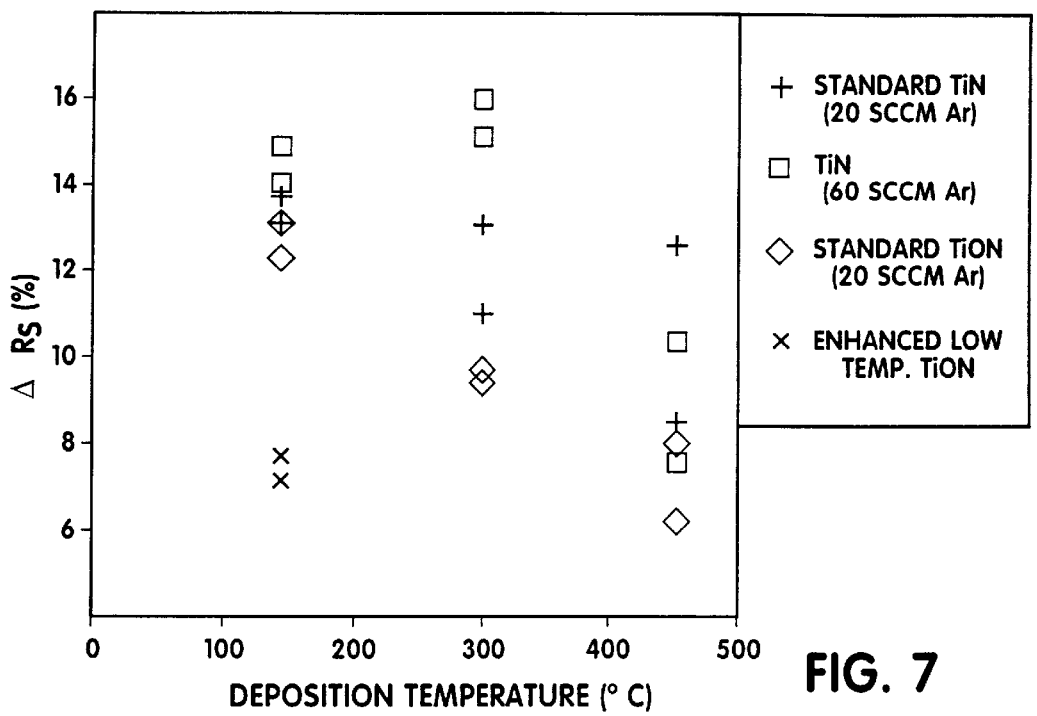
FIG. 7 is a graph showing the change in sheet resistance of a Ti(40 nm)-barrier (75 nm)-AlCu 0.5%(350 nm) stacks after annealing as a function of barrier deposition temperature.

FIG. 7 shows the change in sheet resistance of Ti(40 nm)-barrier (75 nm)/Al 0.5% Cu(350 nm) stacks after furnace annealing at 450° C. for one hour in nitrogen as function of barrier deposition temperature. The Ti and barrier depositions were performed without a vacuum break. The Al deposition temperature was 200° C. for all stacks. Note that the TiON films always have a lower sheet resistance change than the TiN films, and have the best performance at a deposition temperature of 450° C.

Figure 8A:
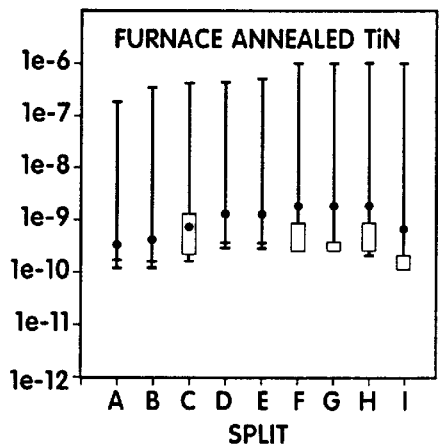
FIGS. 8A–8C are graphs showing leakage current of Ti(25 nm)-barrier (100 nm)-AlCu 0.5%(75 nm)-TiN(45 nm) stacks.
Figure 8B:
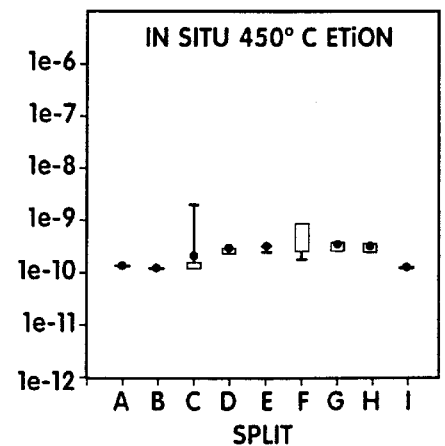
Figure 8C:
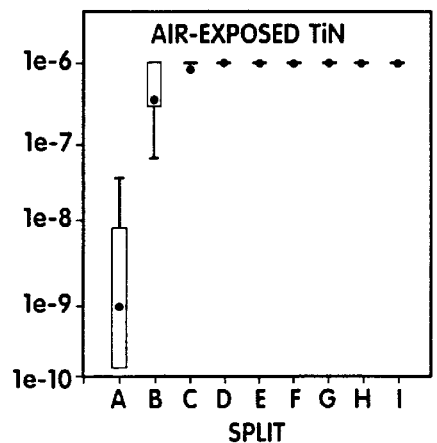

FIGS. 8A–8C show the leakage current of Ti(25 nm)-barrier(100 nm)/Al 0.5% Cu(75 nm)/TiN(45 nm) stacks. In FIGS. 8A–8C the upper and lower limits of the experimental data are shown by horizontal lines. The 25th through 75th percentile are contained within the rectangle, the 10th through the 90th percentile are contained within the vertical bars attached to the rectangle, and the remaining data shown by dots. In some data sets, for example FIG. 8A split A, the 25th–75th percentile spread is so narrow that the rectangle appears as a horizontal line. Any sample having a leakage current greater than 1e-9 is commercially unusable and is scrapped. As can be seen from FIGS. 8A–8C there are large amounts of scrap in the furnace annealed TiN and the air-exposed TiN, while there is essentially no scrap in the (E)TiON of the present invention.

Split A shows data for the as-deposited stack, splits B-E show data for stacks annealed at 450° C. for two hours each, and splits F-I show data for stacks annealed at 500° C. for two hours each. The stack was deposited on 0.7×1.0 μm champagne glass features, with the vertical (having a wall angle greater than 85 degrees) portion of the feature having a height of 0.4 μm. The deposition temperature for the barriers was 300° C. for FIGS. 8A and 8C and was 450° C. for FIG. 8B. The furnace anneal was done at 400° C. for 25 minutes in forming gas which is predominately nitrogen with approximately 5% hydrogen. The Al deposition temperature was 300° C. for all splits. The anneals consisted of four two hour cycles at 450° C. and four 2 hour cycles at 500° C. The data in these figures show that 450° C. TiON outperforms both in situ 450° C. and furnace annealed TiON.

It has been accepted that the addition of oxygen to TiN improves the film's performance as a diffusion barrier. FIG. 7 shows that the TiON exhibits barrier performance superior to TiN at all barrier deposition temperatures evaluated. FIGS. 8A and 8C also show the results of leakage current evaluations of Ti-barrier/Al/TiN stacks containing air-exposed and furnace annealed TiN, and 450° C. TiON barriers. The electrical evaluations were performed for the as-deposited stacks and after annealing.

As is clear in FIG. 6, there is a significant concentration of oxygen at the Al-(E)TiON interface as compared to the Al TiON interface. The (E)TiON is formed by increasing the flow of oxygen during the final phase of deposition. FIGS. 4, 5 and 6 and Table II show that incorporation of oxygen in the TiN layer during deposition correlates to texture degradation of the subsequently deposited Al. Barrier deposition temperature is not believed to be a significant factor in the sense that the Al deposited on 150° C. TiN is only slightly less oriented than the Al deposited on the 450° C. barrier layers, as is shown in Table II.

The steps of depositing the layers are shown in Table III. Step 1 is a Ti deposition step performed in an inert (argon) atmosphere. Step 2 is an idle step which is performed with gas flow but without any power applied. Step 3 is the primary barrier deposition step which was performed with various $Ar_1$ $N_2$ and $O_2$ flows. The various gas flows are shown in TABLE IV. While the use of Ar is shown, any diluent gas which does not react with Ti may be used. Step 4 is a power ramp down to bring the shuttering power down to that used in the subsequent target clean step. Step 5 is a cleaning step. Each wafer had a sputter etch step prior to deposition and a 1 KW target cleaning step (step 5) after deposition. The 1 KW target clean step is not an essential to producing good Al texture, nor does it effect any barrier properties.

In Table III, x, z, a, b, and c are variables. The specific argon, nitrogen and oxygen gas flows as well as temperature and throttle usage are set forth in TABLE IV. For wafers 8–13 a cooling step was performed after deposition of the barrier layer so that all Al deposition was performed at 200° C. The cooling step included a 0 KW, 100 sccm Ar flow for 24 seconds followed by a 15 KW, 100 sccm Ar flow for 21 seconds with back plane (BP) gas. BP gas flows between the stage upon which the sample is mounted during the deposition and transfers heat between the wafer and the stage using a gas conduction technique.

TABLE III

| STEP No. | 1 | 2 | 3 | 4 | 5 |
|---|---|---|---|---|---|
| Power (KW) | 8 | 0 | 12 | 1 | 1 |
| Time(s) | 7 | 5 | 14 | 5 | 5 |
| Argon (sccm) | 75 | x | x | x | 75 |
| N2 (sccm) | 0 | 0 | z | 25 | 0 |
| O2 (sccm) | 0 | 0 | a | b | 0 |
| BP Gas | yes | yes | yes | yes | yes |
| Throttle | c | c | c | c | c |

TABLE IV

| wafer # | x | z | a | b | c | Temp (C.) | Process | Step 3 Pressure (m Torr) |
|---|---|---|---|---|---|---|---|---|
| 1 | 20 | 100 | 0 | 0 | no | 150 | 1 | 2.8 |
| 2 | 20 | 100 | 0 | 0 | yes | 150 | 2 | 5.5 |
| 3 | 40 | 100 | 0 | 0 | no | 150 | 3 | 3.3 |
| 4 | 60 | 100 | 0 | 0 | no | 150 | 4 | 3.8 |
| 5 | 20 | 100 | 4 | 4 | no | 150 | 5 | 2.8 |
| 6 | 20 | 100 | 4 | 8 | no | 150 | 6 | 2.9 |
| 7 | 40 | 100 | 4 | 4 | no | 150 | 7 | 3.3 |
| 8 | 20 | 100 | 0 | 0 | no | 300 | 1 | 2.8 |
| 9 | 60 | 100 | 0 | 0 | no | 300 | 4 | 3.8 |
| 10 | 20 | 100 | 4 | 4 | no | 300 | 5 | 2.9 |
| 11 | 20 | 100 | 0 | 0 | no | 450 | 1 | 2.8 |
| 12 | 60 | 100 | 0 | 0 | no | 450 | 4 | 3.8 |
| 13 | 20 | 100 | 4 | 4 | no | 450 | 5 | 2.9 |

The invention provides a process for forming a titanium oxynitride barrier layer formed on a substrate comprising the steps of sputter depositing Ti in an atmosphere with a large nitrogen to oxygen ratio to form titanium oxynitride. Preferably, the flow ratio of nitrogen to oxygen is greater than about approximately 15:1. Alternatively, the flow ratio of nitrogen to oxygen is greater than about approximately 25:1. Preferably also, the Ti is nitrided by the nitrogen during the sputter deposition process. The titanium oxynitride is preferably enhanced titanium oxynitride, and further, the enhanced titanium oxynitride is preferably formed by sputter depositing said Ti in an atmosphere which is at about 78% nitrogen at a temperature of at least about 300° C. Additionally, the sputter deposition process is preferably performed at a temperature of at least about 300° C. The flow of nitrogen is preferably at least 100 sccm, or at least 80 sccm. The flow of oxygen is preferably about 4 sccm. Preferably, the titanium oxynitride is furnace annealed after deposition.

The invention further provides a process for forming a titanium oxynitride barrier layer formed on a substrate comprising the steps of providing a substrate having surface discontinuities thereon, depositing a Ti film on said substrate, sputter depositing a film onto said deposited Ti film, from a Ti target in an atmosphere with a nigh N to O ratio to form titanium oxynitride on said substrate, and depositing an Al conductor onto said substrate. Preferably, the sputter deposition step is performed at an elevated temperature, preferably at least about 300° C.

The invention provides a titanium oxynitride film formed on a substrate by the process of sputter depositing a film onto a substrate in an atmosphere which is predominantly N at a substrate temperature sufficient to allow oxygen to escape out of the titanium oxynitride. In the process by which the titanium oxynitride film is formed, the atmosphere preferably includes nitrogen gas, oxygen gas and a diluent gas; the ratio of the flow of nitrogen to the flow of oxygen is preferably at least about 15:1 or at least about 25:1; the flow of nitrogen is preferably at least 100 sccm, and the flow of oxygen is preferably about 4 sccm; the titanium oxynitride is preferably enhanced titanium oxynitride; and/or the substrate temperature is at least about 300° C., and preferably at least about 450° C.

The invention further provides a substrate having a titanium, titanium oxynitride, and conductor film stack formed thereon manufactured by the process of providing a substrate, depositing a Ti layer upon said substrate, depositing a titanium oxynitride layer upon said Ti layer by a physical deposition process; and depositing a conductor layer upon said titanium oxynitride layer. Preferably, in the process by which the substrate is manufactured, the Ti layer is metallic Ti; the titanium oxynitride layer is enhanced titanium oxynitride; the physical deposition process is sputter deposition, preferably by nitrided titanium ejected from a sputtering target during the sputtering process or is performed in a high nitrogen atmosphere provided by a flow of nitrogen gas, oxygen gas and at least one diluent gas, preferably wherein said atmosphere is provided by the flow of gasses including nitrogen gas, oxygen gas and a diluent gas, or wherein the ratio of the flow of nitrogen to the flow of oxygen is at least about 15:1 and preferably at least about 25:1, and preferably wherein the flow of nitrogen is sufficiently high to nitride the Ti target surface during the sputter deposition step and/or wherein the flow of nitrogen is at least 100 sccm preferably with the flow of oxygen at least 4 sccm or is about 4 sccm.

The invention further provides a substrate having a titanium, titanium oxynitride and conductor film stack formed thereon manufactured by the process of providing a substrate, depositing a Ti layer upon said substrate, depositing a titanium oxynitride layer upon said Ti layer by a physical deposition process; and depositing a conductor layer upon said titanium oxynitride layer wherein: the conductor layer is selected from the group consisting of Al and Cu, or wherein the substrate temperature is at least about 300° C., or wherein the substrate temperature is at least about 450° C.

What is claimed is:

1. A process of forming an interconnect stack comprising first a Titanium (Ti) layer, followed by a titanium oxynitride barrier (TiON) layer, and finally an aluminum (Al) layer, such that the specific formation process of the titanium oxynitride results in a low resistivity of said layer and provides for a good crystalline texture of the subsequently deposited Al, the process comprising:

providing a substrate having contacts/vias thereon;

sputter depositing a first conductive layer of Ti on the surface of the substrate in a vacuum deposition apparatus;

forming a second conductive barrier layer of TiON upon the Ti without removing the substrate from the vacuum deposition apparatus by sputtering Ti in an argon, nitrogen, and oxygen atmosphere where the nitrogen to oxygen ratio is in the range of 15:1 to at least 25:1 at substrate temperature of at least about 300° C.; and sputter depositing an Al layer upon the TiON layer in the vacuum deposition apparatus, wherein there is substantially no oxygen found at the interface between the Al layer and the second conductive barrier layer of TiON.

2. The process of claim 1 wherein the TiON conductive barrier layer is deposited at a temperature of 450° C.

3. The process of claim 1 wherein the TiON conductive barrier layer is a TiON layer formed by increasing oxygen flow during the deposition thereof.

4. The process of claim 3 wherein the TiON conductive barrier layer is deposited at a temperature of 450° C.

5. The process of claim 1 wherein the nitrogen has a flow rate of approximately 100 sccm and the oxygen has a flow rate of approximately 4 sccm.

6. The process of claim 2 wherein the nitrogen has a flow rate of approximately 100 sccm and the oxygen flow is approximately 4 sccm for about 75% of the deposition of the TiON layer, and oxygen flow is increased to 8 sccm for the remainder of the deposition of the TiON layer.

7. The processes of claim 6 in which the nitrogen and oxygen have flow rates that are reduced to zero while continuing the Ar flow for approximately 5 seconds.

8. The process of claim 1 wherein the nitrogen and oxygen have flow rates that are reduced to zero while continuing the Ar flow for approximately 5 seconds.

9. The process of claim 1 wherein the nitrogen has a flow rate reduced to approximately 25 sccm while the oxygen has a flow rate of 4 sccm, followed by reducing the oxygen and nitrogen flows to 0 while continuing the Ar flow for approximately 5 seconds.

* * * * *

UNITED STATES PATENT AND TRADEMARK OFFICE
CERTIFICATE OF CORRECTION

PATENT NO. : 6,107,195
DATED : August 22, 2000
INVENTOR(S) : Bruce David Gittleman & Vu Bui Page 1 of 1

It is certified that error appears in the above-identified patent and that said Letters Patent is hereby corrected as shown below:

Column 3,
Line 39, please delete "and a increases" and replace with -- and σ increases --;

Column 5,
Line 46, please delete "Ar" and replace with -- Arg --;

Column 7,
Line 39, please add the paragraph -- While the present invention has been illustrated by a description of various embodiments and while these embodiments have been described in considerable detail, it is not the intention of the applicants to restrict or in any way limit the scope of the appended claims to such detail. Additional advantages and modifications will readily appear to those skilled in the art. The invention in its broader aspects is therefore not limited to the specific details, representative apparatus and method, and illustrative example shown and described. Accordingly, departures may be made from such details without departing from the spirit or scope of applicant's general inventive concept --.

Signed and Sealed this

Eleventh Day of September, 2001

Attest:

*Nicholas P. Godici*

*Attesting Officer*

NICHOLAS P. GODICI
*Acting Director of the United States Patent and Trademark Office*